(12) United States Patent
Kumar et al.

(10) Patent No.: US 11,393,520 B1
(45) Date of Patent: Jul. 19, 2022

(54) HIGH PSR VOLTAGE REGULATOR ARCHITECTURE FOR GDDR6 APPLICATION

(71) Applicant: CADENCE DESIGN SYSTEMS, INC., San Jose, CA (US)

(72) Inventors: Vinod Kumar, Uttar Pradesh (IN); Prakash Kumar Lenka, Karnataka (IN)

(73) Assignee: Cadence Design Systems, Inc., San Jose, CA (US)

( * ) Notice: Subject to any disclaimer, the term of this patent is extended or adjusted under 35 U.S.C. 154(b) by 29 days.

(21) Appl. No.: 17/020,541

(22) Filed: Sep. 14, 2020

(51) Int. Cl.
G11C 11/4074 (2006.01)
H03K 5/1252 (2006.01)
G11C 11/4076 (2006.01)

(52) U.S. Cl.
CPC ...... G11C 11/4074 (2013.01); G11C 11/4076 (2013.01); H03K 5/1252 (2013.01)

(58) Field of Classification Search
CPC ............ G11C 11/4074; G11C 11/4076; H03K 5/1252
See application file for complete search history.

(56) References Cited

U.S. PATENT DOCUMENTS 10,768,650 B1 * 9/2020 Huang .................... G05F 1/575

* cited by examiner

Primary Examiner — Daniel C Puentes
(74) Attorney, Agent, or Firm — Foley & Lardner LLP

(57) ABSTRACT

The embodiments described herein provide for methods and systems for removing power supply induced jitter from a Phase Lock Loop to provide a Power Supply Induced jitter-free clock signal to a system-on-a-chip and GDDR6 DRAM interface. In operation, a circuit reduces a DC offset between a reference voltage and a voltage regulator output to identify low frequency noise on the voltage regulator output to apply as negative feedback to reduce the low frequency noise on the voltage regulator output. The bandwidth of the circuit is increased to detect high frequency noise, which is applied as negative feedback on the voltage regulator output. Very high frequency noise is then detected and applied as negative feedback to the voltage regulator output. The circuit outputs a regulated output equal to the reference voltage and immune to the low, high, and very high frequency noise of power delivery network supply to the regulator.

20 Claims, 7 Drawing Sheets

HIGH PSR VOLTAGE REGULATOR ARCHITECTURE FOR GDDR6 APPLICATION

TECHNICAL FIELD

The present invention relates generally to the field of voltage regulation in high-speed memory interface systems. More specifically, the present invention relates generally to reduction of power supply induced jitter in a high-speed memory interface system.

BACKGROUND

Emerging technologies like artificial intelligence, machine learning, and high-speed graphics need a high-speed memory interface to communicate with high bandwidth memory, such as dynamic random access memory (DRAM), for use in graphics cards, game consoles, and high-performance computing, such as graphics double data rate type six synchronous dynamic random access memory (GDDR6 DRAM), which has an operating speed of 24 Gbps. In a system-on-a-chip (SOC) interfacing with a GDDR6 DRAM, a write mode allows the SOC to transmit parallel data and an SOC clock to the DRAM, and the DRAM samples the parallel data signals using the SOC clock to obtain a set of data samples to be stored in the DRAM. In a read mode, the DRAM transmits parallel data back to the SOC, and the SOC reuses the SOC clock to sample the parallel data transmitted from the DRAM. In such a device, the DRAM may also transmit an Error Detection Code (EDC) signal, which the SOC uses to align the SOC clock with the parallel data received from the DRAM. The system may include a Phase Lock Loop (PLL) used to generate the clock for the system connected to a same power supply as the SOC and GDDR6 DRAM.

In some high-performance memory systems, like GDDR6, there can be accumulation jitter in the PLL due to a delay of up to 2.5 ns between the clock edge at which the DRAM transmits parallel data to the SOC and the clock edge at which SOC actually receives the sampled DRAM data. The accumulation jitter includes random noise dominated by device-induced noise and deterministic noise dominated by noise on the power supply. The deterministic noise may also include high levels of Simultaneous Switching Noise (SSN) on the power supply caused by the use of a parallel interface DRAM system (e.g., such as GDDR6), and dominates the accumulation jitter. The accumulation jitter results in a reduction of the clock read trimming margin for the SOC receiver, increasing the likelihood of a failed read operation in such high-speed systems.

To operate at full capacity, GDDR6 systems require minimization of the deterministic noise of the accumulation jitter, such as reducing power supply induced jitter (PSIJ) in the PLL, so that the PLL generates a clock with minimal delay. One conventional method of improving PSIJ includes providing the PLL with a dedicated power supply, however, the package coupling and inside chip coupling between supplies can cause the actual power supply reaching the PLL to be very noisy. Additional methods include using an on-chip regulator with high Power Supply Rejection (PSR) to filter out power supply noise before it reaches the PLL. Two such conventional on-chip regulators known in the art involve types of Metal Oxide Semiconductor Field Effect Transistors (MOSFETs) drivers: an N-type MOSFET (NMOS) power driver-based, on-chip regulator architecture 100a, shown in FIG. 1A; and a P-type MOSFET (PMOS) power driver-based, on-chip regulator architecture 100b, shown in FIG. 1B.

The conventional NMOS power driver-based regulator 100a, shown in FIG. 1A, includes a comparator 102a and an NMOS power driver 104a which provides the regulator output to a PLL 106a and to an input of the comparator as negative feedback. This architecture offers the benefits of low output impedance, improved load current regulation, and good PSR. However, in such an architecture, the power supply voltage VDDQ is required to be greater than the sum of the regulated output voltage VREG and the NMOS power driver 104a threshold voltage (Vth). In a GDDR6 system during a 5 nm T7G process, the power supply voltage VDDQ of GDDR6 can be as low as 1.21V, the regulated output voltage VREG can be as high as 0.88V, and the Vth can be as high as 0.5V; the power supply voltage VDDQ is insufficient to power the GDDR6 process, as 0.88V+ 0.5V=1.38V, which is greater than the low end of power supply voltage VDDQ at 1.21V. Thus, the NMOS power driver-based regulator 100a cannot be used for GDDR6 applications because of the architectures power supply requirements.

The conventional PMOS power driver-based regulator 100b, depicted in background art FIG. 1B, includes a comparator 102b and a PMOS power driver 104b. Similar to the NMOS power driver based solution, the PMOS power driver based solution provides the regulator output to both a PLL 106b and an input of the comparator as negative feedback. Unlike the NMOS-based architecture 100a described with reference to FIG. 1A, the PMOS power driver-based regulator architecture 100b does not suffer from the same power supply limitations and can operate for the power supply voltage VDDQ power supply less than regulated output voltage VREG plus PMOS power driver 104b threshold voltage (Vth). The PMOS architecture also provides good PSR for low frequency power supply noise. However, the PSR of this regulator architecture is limited by the bandwidth of the comparator 102b. GDDR6 requires 200 MHz-300 MHz of bandwidth. Increasing the bandwidth of comparator 102b can compromise the stability of the negative feedback loop, resulting in limited bandwidth and poor PSR for high frequency power supply noise. Thus, the PMOS power driver-based regulator 100b cannot be used for GDDR6 applications because the bandwidth limitations cannot effectively filter the high frequency power supply noise.

SUMMARY

Disclosed herein are systems and methods for voltage regulation designed to address the above-noted shortcomings of conventional voltage regulation of power supply input above-noted shortcomings of conventional voltage regulation of power supply input to a PLL for clock generation in high-speed memory systems, and may provide additional or alternative benefits as well. There is a desire for new methods and/or hardware components that provide good PSR to minimize PSIJ on the power supply of the PLL to enable the PLL to generate a clock with minimal accumulated deterministic jitter. The embodiments described herein provide for a voltage regulator architecture with high PSR capable of reducing the PSIJ of the PLL power supply across a large bandwidth of frequencies. The embodiments described herein further provide for a voltage regulator architecture capable of meeting the deterministic jitter target for maintaining the timing budget for a 24 Gbps GDDR6 PLL interface.

In an embodiment, a voltage regulator circuit comprises a first feedback circuit loop configured to receive a reference voltage and a voltage regulator output; detect a low frequency noise from a regulator power supply on the voltage regulator output using the reference voltage and the voltage regulator output; and apply the low frequency noise as a low frequency negative feedback to the voltage regulator output, thereby reducing the low frequency noise on the voltage regulator output. The circuit further comprises a second feedback circuit loop having a comparatively higher bandwidth than the first feedback circuit loop, and configured to: increase bandwidth of the voltage regulator circuit, and reduce a high frequency noise from the regulator power supply. The circuit further comprises a third feedback circuit loop configured to: detect a very high frequency noise from the regulator power supply on the voltage regulator output; apply the very high frequency noise as a very high frequency negative feedback to the voltage regulator output, thereby reducing the very high frequency noise on the voltage regulator output; and output a regulated output equal to the reference voltage and immune to the low frequency noise, the high frequency noise, and the very high frequency noise from the regulator power supply.

In another embodiment, a method for voltage regulation in a regulator circuit, the method comprising receiving, by a first feedback circuit loop, a reference voltage and a voltage regulator output; detecting, by the first feedback circuit loop, a low frequency noise from a regulator power supply on the voltage regulator output using the reference voltage and the voltage regulator output; applying, by the first feedback circuit loop, the low frequency noise as negative feedback to the voltage regulator output, thereby reducing the low frequency noise on the voltage regulator output; increasing, by a second feedback circuit loop, bandwidth of the circuit, the second feedback circuit loop having a comparatively higher bandwidth than the first feedback circuit loop, reducing, by the second feedback circuit loop, high frequency noise on the voltage regulator output; detecting, by a third feedback circuit loop, very high frequency noise from the regulator power supply on the voltage regulator output; applying, by the third feedback circuit loop, the very high frequency noise as negative feedback to the voltage regulator output, thereby reducing the very high frequency noise on the voltage regulator output; and outputting, by the third feedback circuit loop, a regulated output equal to the reference voltage and immune to the low frequency noise, the high frequency noise, and the very high frequency noise from the regulator power supply.

It is to be understood that both the foregoing general description and the following detailed description are exemplary and explanatory and are intended to provide further explanation of the invention as claimed.

BRIEF DESCRIPTION OF THE DRAWINGS

The present disclosure can be better understood by referring to the following figures. The components in the figures are not necessarily to scale, emphasis instead being placed upon illustrating the principles of the disclosure. In the figures, reference numerals designate corresponding parts throughout the different views.

DETAILED DESCRIPTION

Figure 1B:
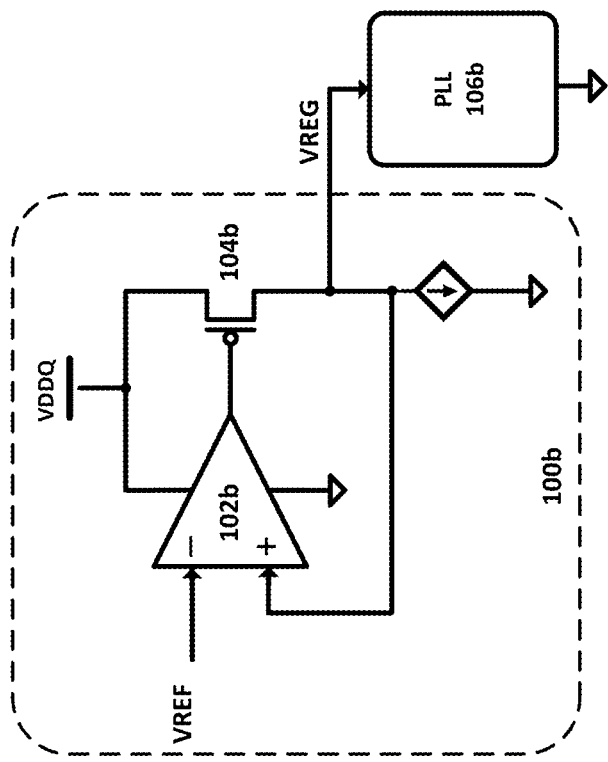
FIGS. 1A-1B are block diagrams illustrating conventional voltage regulator architectures.
Figure 1A:
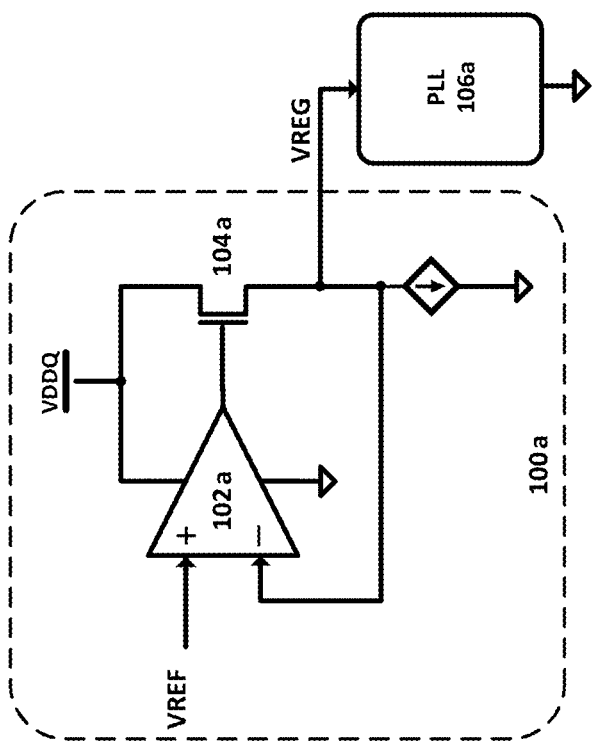

Reference will now be made to the exemplary embodiments illustrated in the drawings, and specific language will be used here to describe the same. It will nevertheless be understood that no limitation of the scope of the invention is thereby intended. Alterations and further modifications of the inventive features illustrated here, and additional applications of the principles of the inventions as illustrated here, which would occur to a person skilled in the relevant art and having possession of this disclosure, are to be considered within the scope of the invention.

The embodiments herein provide an improved system and method for voltage regulation of a power supply by combining several negative feedback circuit loops, also called "feedback loops," targeted towards or otherwise designed for different frequencies and bandwidths to reduce the deterministic accumulation jitter of the PLL in a 24 Gbps GDDR6 PLL. The voltage regulator includes a low frequency feedback loop directed towards reducing a direct current (DC) offset between an output voltage and an input reference voltage. The low frequency feedback loop has a bandwidth (e.g., 20 MHz bandwidth) sufficient to detect and reduce noise at low frequency (e.g., frequencies less than 20 MHz).

The voltage regulator architecture also includes a high frequency feedback loop directed towards increasing the bandwidth of the circuit by having a comparatively higher bandwidth (e.g., 200 MHz bandwidth) than the low frequency feedback loop, and detects and reduces noise at high frequency (e.g., frequencies from 20 MHz to 100 MHz).

The voltage regulator architecture further includes a very high frequency detection and correction feedback loop directed towards providing improvement in high frequency PSR. The very high frequency feedback loop has a bandwidth that is comparatively higher than the bandwidth of the high frequency feedback loop, is centered at a resonant frequency of a power supply to the circuit (e.g., centered at or around 167 MHz), and is sufficient to detect and reduce noise at very high frequency (e.g., frequencies from 100 MHz to 300 MHz). The feedback loops in the voltage regulator architecture are linked together and operate as a single circuit concurrently to beneficially filter PSIJ and reduce low, high, and very high frequency noise from the power supply signal across a large bandwidth of frequencies for input to the PLL.

Figure 2A:
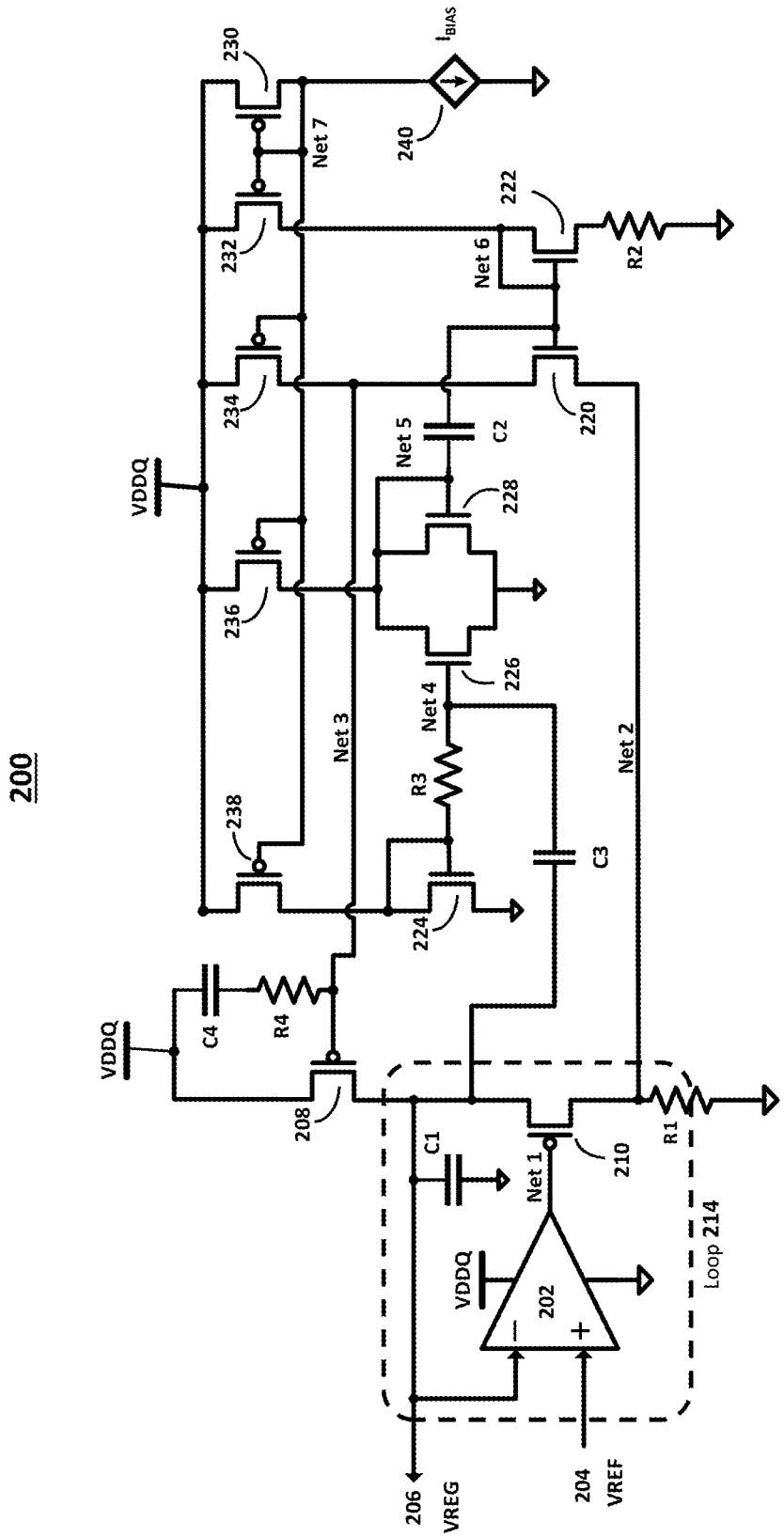
FIGS. 2A-2C are schematics illustrating a same voltage regulator architecture highlighting different feedback circuit loops, according to an embodiment.
Figure 2B:
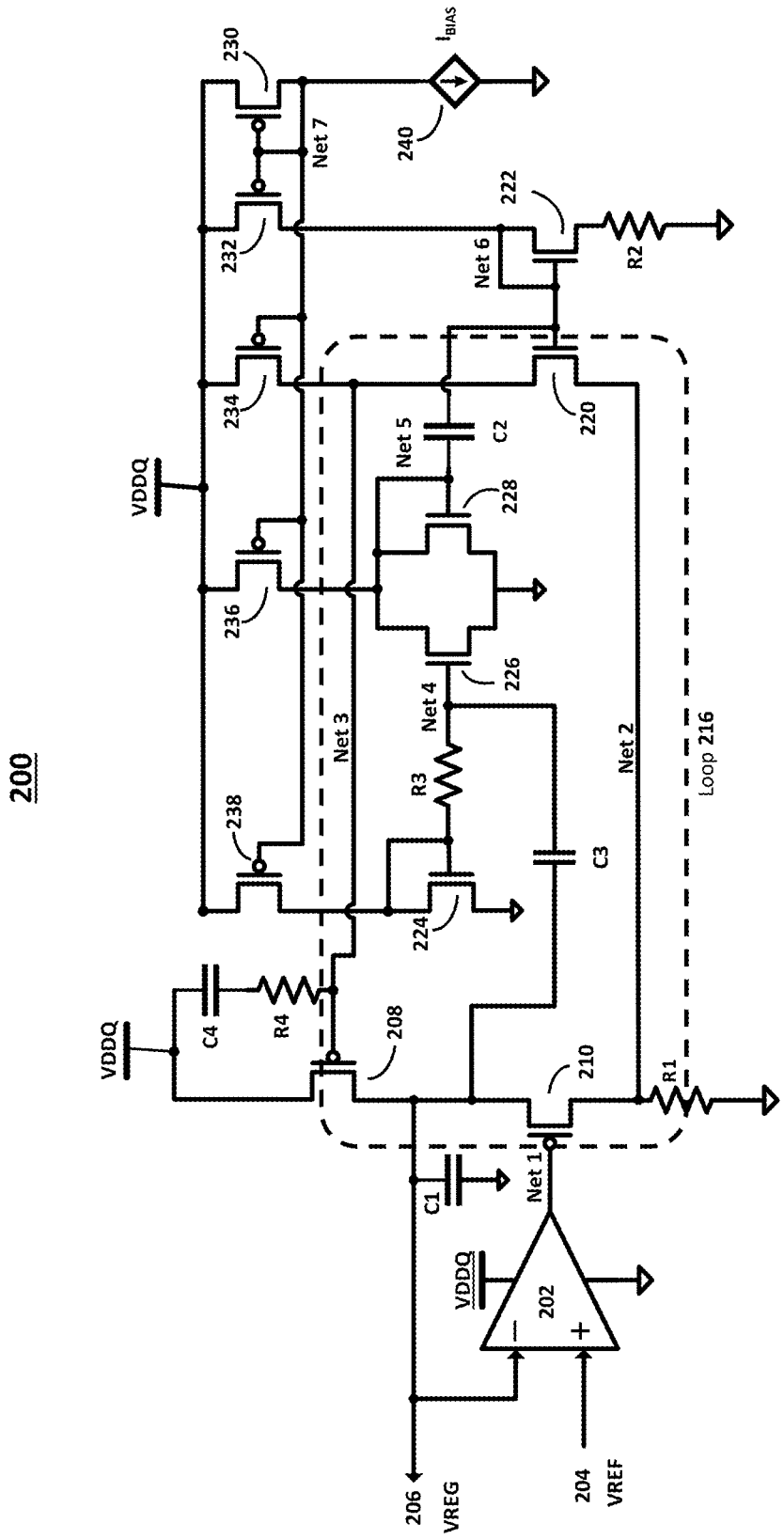
Figure 2C:
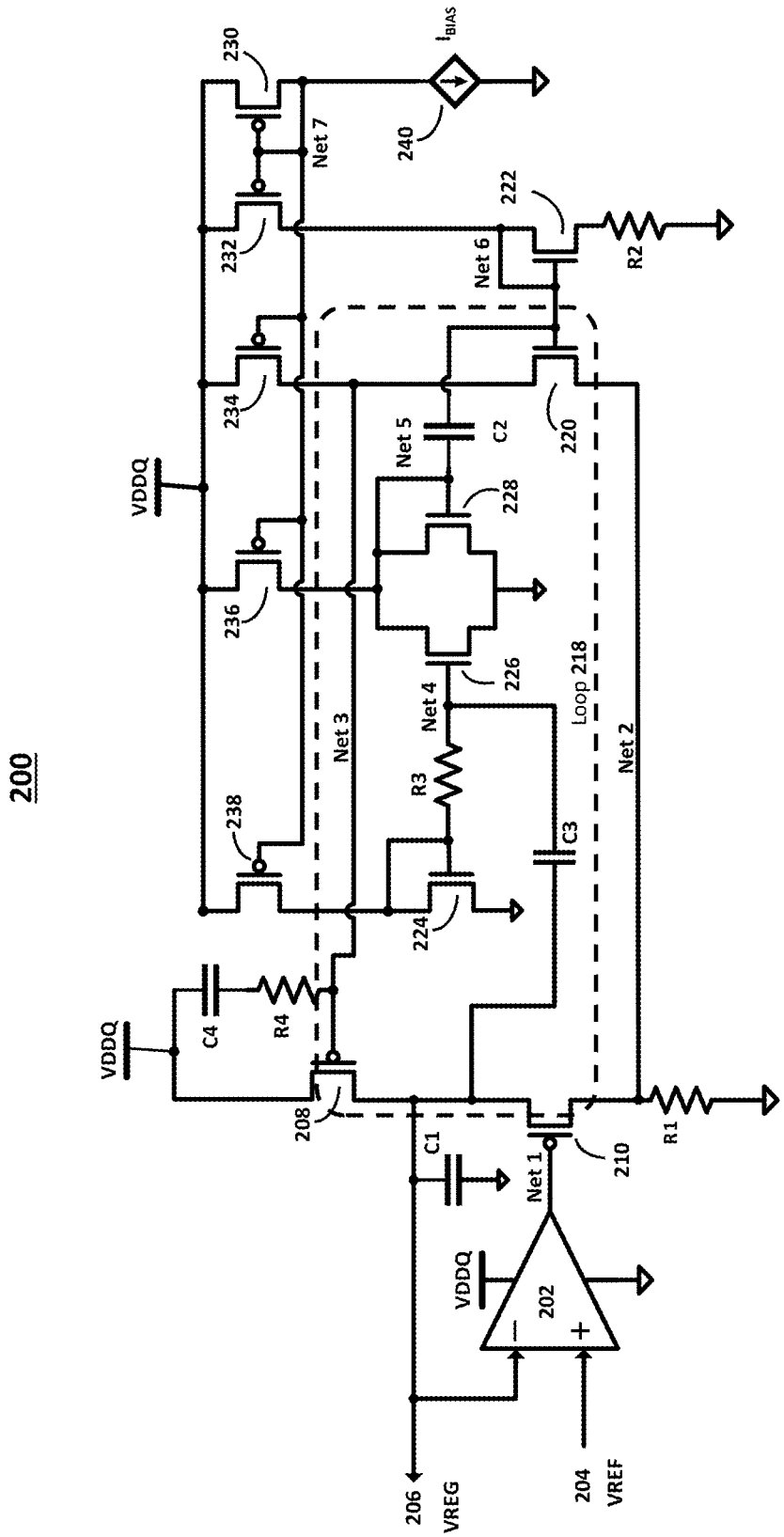

FIGS. 2A-2C illustrate a high PSR voltage regulator architecture schematic as a circuit 200, according to an illustrative embodiment. Circuit 200 includes a first feedback loop 214, that can receive a reference voltage as a first input signal and a voltage regulator output (an output of the regulator circuit) as a second input signal, detect a low frequency noise on the second input signal using the first input signal and the second input signal, and apply the low frequency noise as a low frequency negative feedback to the second input signal, thereby reducing the low frequency noise on the output of the regulator.

Circuit 200 further includes a second feedback circuit loop 216, which has a comparatively higher bandwidth than first feedback loop 214, and can increase bandwidth of the circuit 200. First feedback loop 214 can detect and reduce a high frequency noise on the regulator output by applying high frequency noise as high frequency negative feedback. Circuit 200 includes a third feedback circuit loop 218 that can detect a very high frequency noise on the regulator output, and apply the very high frequency noise as very high frequency negative feedback to reduce the very high frequency noise on the regulator output. As a result of the functions of the feedback loops 214-218 of the circuit 200, the regulator output signal is unaffected by the low frequency noise, the high frequency noise, and the very high frequency noise produced by the regulator power supply.

Each of FIGS. 2A, 2B, and 2C depicts the circuit 200 and encircles feedback loops 214-218 respectively. Circuit 200 uses feedback loops 214-218 in conjunction with a PMOS power driver 208 that receives a power supply voltage VDDQ (sometimes referred to as regulator power supply voltage) from a power delivery network (not pictured) and outputs a regulated voltage VREG (sometimes referred to as regulated output voltage or regulator output voltage). PMOS power driver 208 receives power supply voltage VDDQ as a source input and negative feedback generated by feedback loops 214-218 as a gate input, and outputs regulated voltage VREG at a drain output, which is a noise and amplitude-reduced version of power supply voltage VDDQ. When received at the gate input of PMOS power driver 208, the negative feedback from feedback loops 214-218 alter a gate-source voltage of PMOS power driver 208. The gate-source voltage determines the amount (e.g., amplitude and frequency) of power supply voltage VDDQ allowed to pass from source to drain in PMOS power driver 208, effectively filtering noise from power supply voltage VDDQ to generate a regulated voltage, regulator output VREG.

Circuit 200 includes a plurality of MOSFET devices (e.g., PMOS transistors and NMOS transistors) to implement voltage regulation through negative feedback. This is achieved across feedback loops 214-218 by using multiple PMOS and NMOS transistors, which act similar to voltage-controlled resistors. In FIGS. 2A-2C, a solid line between source and drain on any of the PMOS or NMOS transistors indicate that it is a depletion-type MOSFET (e.g., normally "on"). When a bias voltage is applied to a gate of any of the MOSFET transistors, the transistor channel begins to pinch-off, meaning transconductance of the MOSFET is changed and an alternating current (AC) power supply signal passing through is altered. Because an output signal (e.g., bias signal) of a MOSFET is an inverted and attenuated version of an input signal, when the output signal is connected to the input signal, negative feedback occurs, meaning the output signal cancels out some of the input signal. The negative feedback over time results in a consistent output signal maintained at a specific level. Since noise is prevalent in high-speed memory systems, PMOS transistors, due to their high noise immunity and controllability with low gate voltages, are ideal for use in circuit requiring negative feedback amplifiers, therefore best used as power drivers in feedback loops 214-218. NMOS transistors are superior for applications involving high-speed switching, and therefore are used in the very high frequency detection by third feedback loop 218.

FIG. 2A illustrates a first feedback loop 214 of circuit 200, according to the embodiment. The first feedback loop 214 may be configured to apply a low frequency noise as a negative feedback to a second input signal, represented as output of the regulator VREG, thereby reducing the low frequency noise on the output of the regulator. First feedback loop 214 can include a comparator 202, a net (Net 1), a PMOS device 210, and a capacitor (C1). In some embodiments, first feedback loop 214 maintains a bandwidth of less than 20 MHz and a DC gain of over 40 dB, and is bandwidth-limited by comparator 202. In some embodiments, the first feedback loop 214 may be configured to receive a first input signal at a first input 204 and the second input signal at a second input 206. Comparator 202 can receive the first input signal at first input 204 and the second signal at second input 206.

The first input signal received at first input 204 is used as a reference voltage VREF, (sometimes referred to as a reference signal). The reference voltage VREF may be set by an SOC (not pictured) coupled to the voltage regulator or another voltage supply source. The second signal received at second input 206 may be at least a portion of regulator output VREG outputted by PMOS power driver 208, which comparator 202 uses as negative feedback to reduce a DC offset between the regulator output VREG and the reference voltage VREF. In operation, comparator 202 effectively identifies differences (representing noise occurring at frequencies within the bandwidth) between regulator output VREG and reference voltage VREF, and can output a signal comprising noise as a DC bias voltage to a PMOS device, such as PMOS device 210, via Net 1. In some embodiments, the first feedback loop 214 may be configured to apply the low frequency noise (e.g., the DC bias voltage) as negative feedback by inputting the low frequency noise to a gate of a PMOS device, for example, PMOS device 210.

Net 1 is a circuit net providing a conductive path between comparator 202 and the gate of PMOS device 210. The gate of PMOS device 210 receives the DC bias voltage, thereby altering a gate-source voltage of PMOS device 210. PMOS device 210 receives a source input signal, which in some embodiments is at least a portion of regulator output VREG. The DC bias voltage generated by comparator 202 allows a portion of regulator output VREG free of the DC bias noise through PMOS device 210.

In some embodiments, the bandwidth of the first feedback loop 214 is less than 20 MHz and a DC gain of the first feedback loop 214 is greater than 40 dB. Because the bandwidth of first feedback loop 214 is less than 20 MHz, first feedback loop 214 can effectively remove low frequency noise in regulator output VREG at PMOS device 210 in this manner. Capacitor C1 reduces high frequency switching noise on the regulator output VREG.

FIG. 2B illustrates second feedback loop 216 of circuit 200, according to an embodiment. Second feedback loop 216 may include one or more devices and has a comparatively higher bandwidth than first feedback loop 214; the comparatively higher bandwidth of second feedback loop 216 increases the overall effective bandwidth of circuit 200 for the purpose of reducing high frequency noise. Second feedback loop 216 includes PMOS device 210, a resistor R1, nets (Net 2, Net 3), NMOS device 220, and PMOS power driver 208.

By having a comparatively higher bandwidth than first feedback loop 214, second feedback loop 216 can increase the bandwidth of the circuit 200 to enable reduction of high frequency noise. In some embodiments, bandwidth of the second feedback circuit loop 216 is 200 MHz. In some cases the second feedback loop 216 may reduce high frequency noise at or around 100 MHz, though the bandwidth of the second feedback loop 216 may be effectively higher (e.g., 200 MHz) than the frequency of the noise intended for reduction (e.g., 100 MHz). In some embodiments, second feedback loop 216 can receive a bias voltage component from the third feedback loop 218 as negative feedback, the bias voltage sufficient to reduce the high frequency noise on the regulator output VREG. In the embodiments described herein, second feedback loop 216 reduces high frequency noise on regulator output VREG by using PMOS power driver 208, PMOS device 210, and NMOS device 220.

Devices of second feedback loop 216 (e.g., PMOS power driver 208, PMOS device 210, and NMOS device 220) may set a DC gain, which typically has an inverse relationship with bandwidth. The DC gain is set low enough to achieve a sufficiently high bandwidth for second feedback loop 216 (and thus, circuit 200). High bandwidth is necessary in order for circuit 200 to correct high frequency noise of the second input signal and regulator output VREG. The bandwidth increase requires some DC bias current, which PMOS device 210 provides to second feedback loop 216 and maintains at a correct voltage level by biasing resistor R1. Second feedback loop 216 may be configured to use a limited DC bias current such that overall power consumption of the regulator is sufficiently small to ensure a majority of current from power supply voltage VDDQ is output to the PLL, and not consumed by circuit 200.

Although not directly in the current path of second feedback loop 216, NMOS device 222, resistors R2, R4, and a capacitor C4 may contribute to other functions of second feedback loop 216. For example, resistor R2 and NMOS device 222 generate a DC bias voltage component for a gate input of NMOS device 220 from input power supply voltage VDDQ, and resistor R4 and capacitor C4 further increase the bandwidth of second feedback loop 216. The DC bias voltage applied to the gate input of NMOS device 220 has two components, the first of which is generated by resistor R2 and NMOS device 222. The first DC bias voltage component is a slightly filtered version of power supply voltage VDDQ, which, when received by a portion of circuit 200 having a bandwidth of 200 MHz (e.g., second feedback loop 216), has noise at frequencies at an upper limit of the bandwidth (e.g., at or around 200 MHz). Thus, the first component of the DC bias voltage (e.g., the DC bias voltage of second feedback loop 216) is applied as negative feedback sufficient to effectively remove high frequency noise.

From PMOS device 210, the portion of regulator output VREG free of low frequency noise passes to a source input of NMOS device 220 via Net 2, which is a circuit net providing a conductive path between a drain output of PMOS device 210 and the source input of NMOS device 220. The DC bias voltage input to the gate of NMOS device 220 determined by resistor R2 and NMOS device 222 determines the portion of regulator output VREG allowed to pass through NMOS device 220. As the bandwidth of second feedback loop 216 is directed towards frequencies greater than 20 MHz, only the noise at those frequencies will be filtered out of regulator output VREG at NMOS device 220. From NMOS device 220, the portion of regulator output VREG now clear of high frequency noise passes to a gate of PMOS power driver 208 as a DC bias voltage via Net 3, which is a circuit net providing a conductive path between a drain output of NMOS device 220 and a gate of PMOS power driver 208. Similar to the result of first feedback loop 214, the result of the implementation of second feedback loop 216 is essentially regulator output VREG free of low frequency noise and high frequency noise.

FIG. 2C illustrates a third feedback loop 218, according to an embodiment. Third feedback loop 218 can detect a very high frequency noise on regulator output VREG. Third feedback loop 218 can further apply the very high frequency noise as negative feedback to regulator output VREG, thereby reducing the very high frequency noise on regulator output VREG.

In some embodiments, the very high frequency noise detected by the third feedback circuit loop is within a predetermined threshold of a power delivery network resonant frequency. Third feedback loop 218 may be a band-pass filter with a band frequency centered on the power delivery network resonant frequency. The effective bandwidth of third feedback loop 218 may be greater than the power delivery network resonant frequency.

In circuit 200, third feedback loop 218 operates as a very high frequency noise detection and correction circuit loop, in which noise at frequencies surrounding a resonant frequency of the power delivery network providing power supply voltage VDDQ. The configuration of third feedback loop 218 achieves the goal of filtering out the very high frequency noise often present in power supply signals and compensates for the limited gain of second feedback loop 216 at high or very high frequencies. The three feedback loops 214-218 cover the range of frequencies (low, high, and very high) necessary to achieve a noise-free (or noise-diminished) regulated power supply to the PLL.

Third feedback loop 218 includes coupling capacitor C2, capacitor C3, nets (Net 3, Net 4, Net 5, Net 6), NMOS device 220, NMOS device 226, and PMOS power driver 208. Using these components, third feedback loop 218 generates a second component of the DC bias voltage. Although not directly in the current path of third feedback loop 218, NMOS device 224, resistor R3, NMOS device 228, and PMOS devices 230-238 contribute to other functions of third feedback loop 218. For example, NMOS device 224 sets a DC bias voltage for a gate of NMOS device 226; resistor R3 works in conjunction with capacitor C3 to perform detection of very high frequency noise on regulator output VREG; NMOS device 228 provides amplification of the detected high frequency noise of regulator output VREG; and PMOS Devices 230-238 provide DC bias current ($I_{BIAS}$ in FIG. 2C) to multiple devices in circuit 200 using a connecting net (Net 7). Net 7 is a circuit net connecting PMOS devices 230-238 to a current device 240 generating $I_{BIAS}$. In some embodiments, current device 240 is a voltage-controlled current source or a current-controlled current source.

In some embodiments, third feedback loop 218 applies the very high frequency noise as the very high frequency negative feedback by amplifying the very high frequency noise, thereby producing amplified very high frequency noise. A gate of NMOS device 220 may receive the amplified very high frequency noise as the negative feedback. A source of NMOS device 220 may receive at least a fraction of the regulator output VREG. Third feedback loop 218 may reduce the very high frequency noise on the regulator output VREG.

In circuit 200, third feedback loop 218 receives regulator output VREG at capacitor C3, which works in conjunction with resistor R3 to detect very high frequency noise. After detection, capacitor C3 outputs the detected noise to a gate of NMOS device 226 via Net 4. NMOS device 226 works with NMOS device 228 to amplify the detected noise, and passes the amplified noise via Net 5 to the gate of NMOS device 220 using coupling capacitor C2. NMOS device 220, in addition to receiving the noise at a gate input, amplifies the detected noise further before outputting the amplified noise to the gate of PMOS power driver 208. This amplified noise is input to the gate of PMOS power driver 208 to change a gate-source voltage of PMOS power driver 208 and to reduce the effective power supply voltage VDDQ noise reaching regulator output VREG. The effective bandwidth of third feedback loop 218 is higher than the power delivery network resonant frequency (e.g., at or about 150 MHz) in order to minimize the impact of high frequency power supply voltage VDDQ noise reaching regulator output VREG. Third feedback loop 218 takes effect once second feedback loop 216 no longer has an effect.

Figure 3:
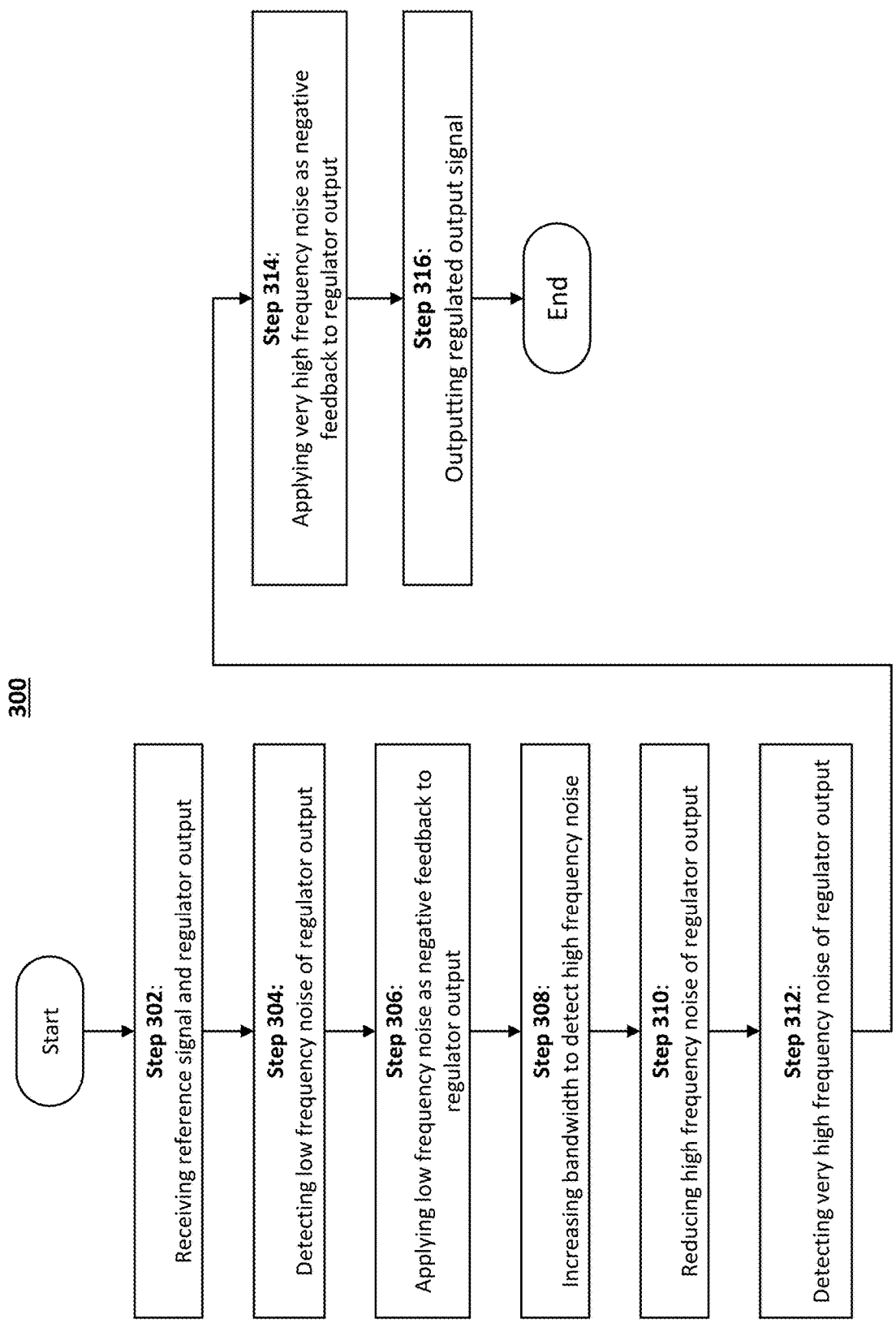
FIG. 3 is a flow chart detailing a circuit-implemented method for voltage regulation, according to an embodiment.

FIG. 3 illustrates a circuit-implemented method 300 for voltage regulation of a power supply signal. It will be appreciated that in a circuit implementing a method 300, the steps may occur simultaneously and continuously during circuit operation.

In a first step 302, a first feedback loop receives a reference voltage and a regulator output voltage. The first feedback loop may be first feedback loop 214 described in FIGS. 2A-2C, and the reference voltage and the regulator output voltage may include reference voltage VREF and regulated output voltage VREG.

In step 304, the first feedback loop detects low frequency noise of the regulator output. Step 304 may be achieved by reducing a DC voltage offset between the reference voltage and the regulator output, which effectively outputs an output signal with a DC voltage value of the reference voltage and AC noise from the regulator output. In many cases, the first feedback loop is bandwidth-limited. As such, only the AC noise at low frequencies are detected and included in the output signal. The first feedback loop outputs the output signal as a low frequency noise signal to a gate of a PMOS device of the first feedback loop, such as PMOS device 210 described in FIGS. 2A-2C.

In step 306, the first feedback loop, or other component of the circuit, applies the low frequency noise signal as negative feedback to the regulator output. For example, the low frequency noise signal is received as an input at the gate of the PMOS device of the first feedback loop, and applied as negative feedback to reduce differences between the regulator output and the low frequency noise. The regulator output is often less noisy than the low frequency noise signal due to the regulated voltage being fed back through the circuit. As such, when the low frequency noise is applied as negative feedback to the regulator output, the low frequency noise signal is used to filter out (e.g., reduce) low frequency level noise on the regulator output as regulator output traverses through the circuit, thereby resulting in a low-frequency filtered regulator output.

In step 308, bandwidth of the circuit implementing method 300 is increased to enable detection of high frequency noise. Step 308 can be achieved by having a second feedback loop, such as second feedback loop 216 described in FIG. 2B, having a comparatively higher bandwidth (e.g., 200 MHz bandwidth) than the first feedback loop (e.g., 20 MHz bandwidth), thereby increasing the overall bandwidth of the circuit. The bandwidth of the circuit is increased a degree sufficient for the second feedback loop to filter (e.g., reduce) noise in a high frequency range.

In step 310, the second feedback loop, or other component of the circuit, reduces high frequency noise of the low-frequency filtered regulator output generated in step 306. The second feedback loop applies a high frequency negative feedback signal at a gate of an NMOS device of the circuit through which both the high frequency negative feedback signal and the low-frequency filtered regulator output pass, such as NMOS device 220 described in FIGS. 2A-2C. The negative feedback signal used to reduce the high frequency noise on the regulator output may include a first DC bias voltage component generated from a noisy power supply signal, where the value or amount of the first DC bias voltage component is sufficient to reduce the high frequency noise in the regulator output at the NMOS device. As will be explained, a second DC bias voltage component is generated in another step and is used by the NMOS device to reduce very high frequency noise.

In step 312, a third feedback loop detects very high frequency noise of the regulator output, where the third feedback loop may be third feedback loop 218 described in FIG. 2C. The components of the third feedback loop capable of responding to noise at very high frequencies above the high frequencies, when components of the second feedback loop stop responding. The very high frequency noise is predominantly power supply signal-induced noise, which can be confidently detected where the third feedback loop has a configuration similar to that of a band-pass circuit and centered on a resonant frequency (e.g., 150 MHz to 170 MHz) of the power delivery network that is generating the power supply signal. Step 312 may further include outputting a very high frequency noise signal including the very high frequency noise.

In step 314, the third feedback loop applies the very high frequency noise signal as negative feedback to reduce very high frequency noise on the low-frequency filtered regulator output generated in step 306. This is achieved by outputting the very high frequency noise signal as a second DC bias voltage component to the NMOS device, which effectively filters the very high frequency noise out of the low-frequency filtered regulator output.

As steps 310 and 314 may be executed simultaneously or near-simultaneously, the DC bias voltage on the gate of the NMOS device can have negative feedback components (e.g., first DC bias voltage component, second DC bias voltage component) directed to reducing high frequency noise and very high frequency noise. This enables the NMOS device, which the low-frequency filtered regulator output through, to filter out (e.g., reduce) both high frequency and very high frequency noise at the same time. Step 314 may further include outputting the regulator output as a regulated output voltage free of low, high and very high frequency noise. In some embodiments, the step 314 may further include amplifying the very high frequency noise signal at an amplifier of the third feedback loop.

In step 316, the third feedback loop outputs the regulated output voltage from which low, high and very-high frequency noise has been filtered. In some cases, the regulator output is outputted as a filtered power supply signal. The regulator output may be outputted to an input of a comparator (e.g., comparator 202), a source of a PMOS device (e.g., PMOS power driver 208), and to the third feedback loop. Method 300 may end with step 316, or may cycle back to 302.

Figure 4A:
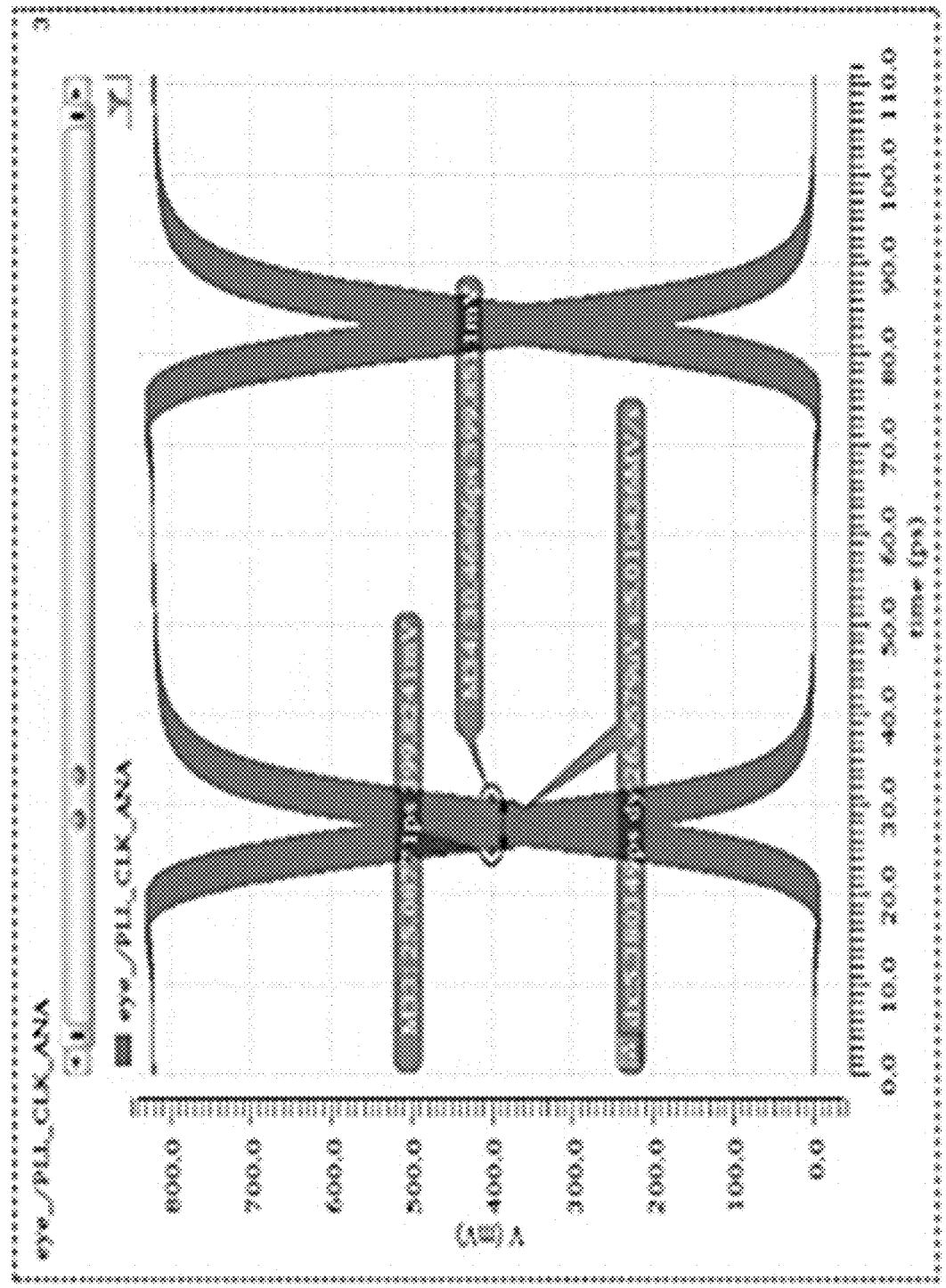
FIG. 4A shows a clock output of a PLL using a conventional voltage regulator architecture.
Figure 4B:
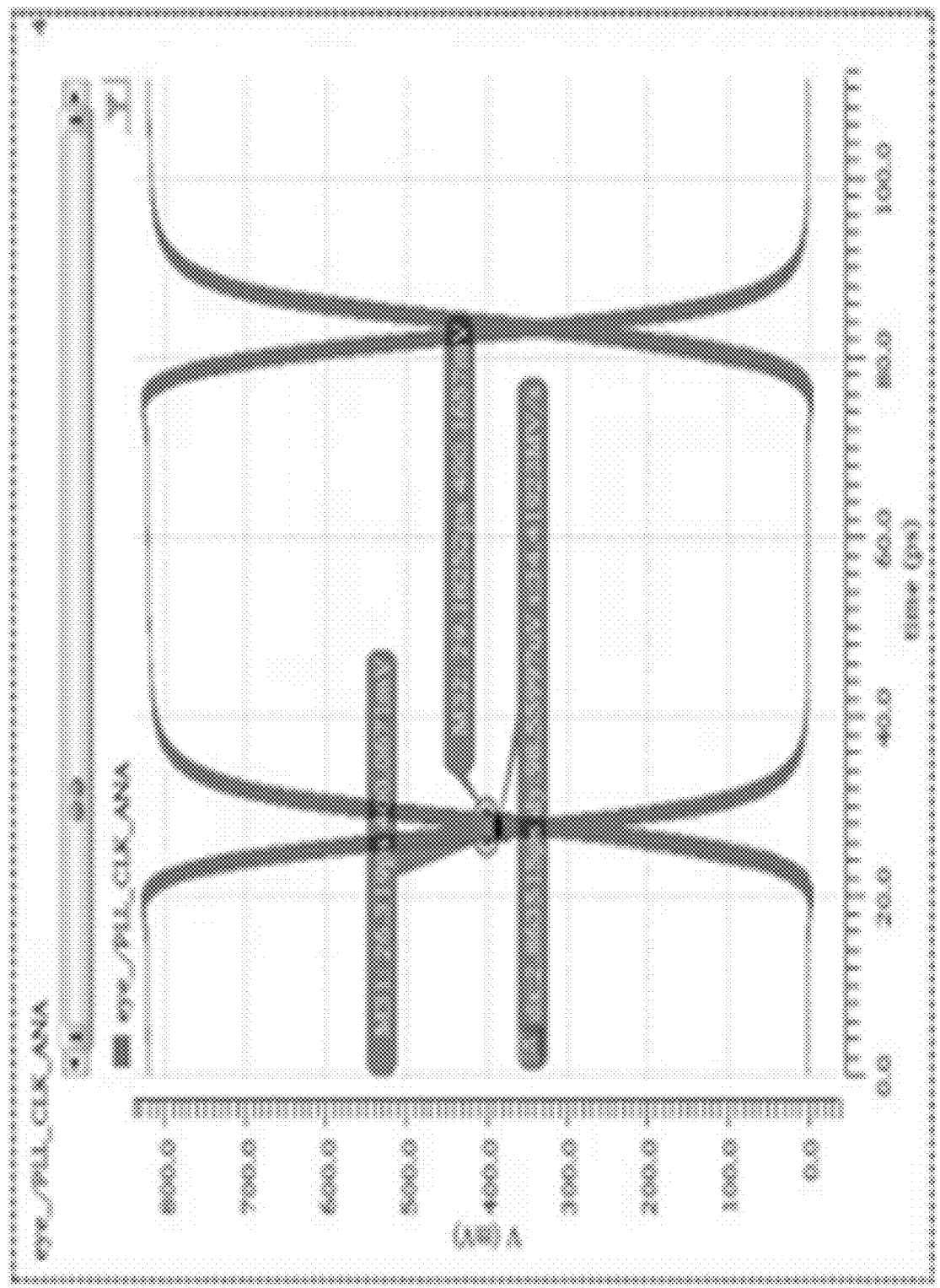
FIG. 4B shows a clock output of a PLL using a voltage regulator architecture, according to an embodiment of the proposed regulator architecture disclosed herein.

FIGS. 4A-4B illustrate effects of implementing circuit 200 and method 300 within a system using a 24 Gbps GDDR6 PLL. FIG. 4A shows an example of PLL clock output deterministic accumulation jitter using an existing regulator architecture, such as that illustrated in FIG. 1B. The accumulation jitter measures at 5.38 ps. FIG. 4B shows an example of PLL clock output deterministic jitter using the proposed regulator architecture of circuit 200. The accumulation jitter in this embodiment measures at 2.86 ps, showing that the proposed architecture reduces the deterministic accumulation jitter of PLL due to power supply noise by 50% with respect to the existing architecture.

With reference to FIGS. 2A-2C, the architecture of circuit 200 is designed such that feedback loops 214-218 work constantly to provide negative feedback to PMOS power driver 208 to reduce noise on the regulator output input to the PLL. FIGS. 4A-4B show that the solution effectively improves the PSR of the regulator output by 6 dB, which is equal to 50%, and reduces the 50 mV peak-to-peak noise of 167 MHz on power supply voltage VDDQ to 2 mV peak-to-peak noise on regulator output voltage VREG. The improvement in the PSR contributes to reducing deterministic accumulation jitter of 24 Gbps GDDR6 PLL by 50%, thereby ensuring achievement of the deterministic accumulation jitter target for the 24 Gbps GDDR6 PLL, and that the tight timing budget for the GDDR6 interface is met. Furthermore, the addition of third feedback loop 218, geared towards very high frequency noise detection and correction for regulator output voltage VREG, provides significant improvement in high frequency PSR with very small controlled bias current.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-Ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A voltage regulator circuit comprising:
   a first feedback circuit loop configured to:
   receive a reference voltage and a voltage regulator output;
   detect a low frequency noise from a regulator power supply on the voltage regulator output using the reference voltage and the voltage regulator output; and
   apply the low frequency noise as a low frequency negative feedback to the voltage regulator output, thereby reducing the low frequency noise on the voltage regulator output;
   a second feedback circuit loop having a comparatively higher bandwidth than the first feedback circuit loop, and configured to:
   increase bandwidth of the voltage regulator circuit, and
   reduce a high frequency noise originating from the regulator power supply by applying a bias voltage comprising a portion of the regulator power supply as a high frequency negative feedback; and
   a third feedback circuit loop configured to:
   detect a very high frequency noise from the regulator power supply on the voltage regulator output;
   apply the very high frequency noise as a very high frequency negative feedback to the voltage regulator output, thereby reducing the very high frequency noise on the voltage regulator output; and
   output a regulated output equal to the reference voltage and immune to the low frequency noise, the high frequency noise, and the very high frequency noise from the regulator power supply.

2. The voltage regulator circuit of claim 1, wherein the bandwidth of the first feedback circuit loop is less than 20 MHz and a DC gain of the first feedback circuit loop is greater than 40 dB.

3. The voltage regulator circuit of claim 1, wherein the first feedback circuit loop is configured to apply the low frequency noise as the low frequency negative feedback by inputting the low frequency noise to a gate of a PMOS device.

4. The voltage regulator circuit of claim 1, wherein the bias voltage is an amount sufficient to reduce the high frequency noise on the voltage regulator output.

5. The voltage regulator circuit of claim 1, wherein the bandwidth of the second feedback circuit loop is 200 MHz.

6. The voltage regulator circuit of claim 1, wherein the third feedback circuit loop, when applying the very high frequency noise as the very high frequency negative feedback, is configured to:
   amplify the very high frequency noise, thereby producing amplified very high frequency noise;
   receive the amplified very high frequency noise as the very high frequency negative feedback at a gate of an NMOS device;
   receive a fraction of the voltage regulator output at a source of the NMOS device; and
   reduce the very high frequency noise on the voltage regulator output.

7. The voltage regulator circuit of claim 1, wherein the very high frequency noise detected by the third feedback circuit loop is within a predetermined threshold of a power delivery network resonant frequency.

8. The voltage regulator circuit of claim 7, wherein the third feedback circuit loop is a band-pass filter with a band frequency centered on the power delivery network resonant frequency.

9. The voltage regulator circuit of claim 7, wherein the bandwidth of the third feedback circuit loop is greater than the power delivery network resonant frequency.

10. The voltage regulator circuit of claim 7, wherein the power delivery network resonant frequency is at or about 150 MHz.

11. A method for voltage regulation in a circuit, the method comprising:
   receiving, by a first feedback circuit loop, a reference voltage and a voltage regulator output;
   detecting, by the first feedback circuit loop, a low frequency noise from a regulator power supply on the voltage regulator output using the reference voltage and the voltage regulator output;
   applying, by the first feedback circuit loop, the low frequency noise as negative feedback to the voltage regulator output, thereby reducing the low frequency noise on the voltage regulator output;
   increasing, by a second feedback circuit loop, bandwidth of the circuit, the second feedback circuit loop having a comparatively higher bandwidth than the first feedback circuit loop,
   reducing, by the second feedback circuit loop, high frequency noise on the voltage regulator output by applying a bias voltage comprising a portion of the regulator power supply as a high frequency negative feedback;
   detecting, by a third feedback circuit loop, very high frequency noise from the regulator power supply on the voltage regulator output;
   applying, by the third feedback circuit loop, the very high frequency noise as negative feedback to the voltage regulator output, thereby reducing the very high frequency noise on the voltage regulator output; and
   outputting, by the third feedback circuit loop, a regulated output equal to the reference voltage and immune to the low frequency noise, the high frequency noise, and the very high frequency noise from the regulator power supply.

12. The method for voltage regulation of claim 11, wherein the bandwidth of the first feedback circuit loop is less than 20 MHz and DC gain of the first feedback circuit loop is greater than 40 dB.

13. The method for voltage regulation of claim 11, wherein applying the low frequency noise as negative feedback comprises inputting the low frequency noise to a gate of a PMOS device.

14. The method for voltage regulation of claim 11, wherein the bias voltage is an amount sufficient to reduce the high frequency noise on the voltage regulator output.

15. The method for voltage regulation of claim 11, further wherein the bandwidth of the second feedback circuit loop is 200 MHz.

16. The method for voltage regulation of claim 11, wherein applying the very high frequency noise as very high frequency negative feedback by the third feedback circuit loop further comprises:
   amplifying the very high frequency noise, thereby producing amplified very high frequency noise;
   receiving, at a gate of an NMOS device, the amplified very high frequency noise as negative feedback;
   receiving, at a source of the NMOS device, a fraction of the voltage regulator output; and
   reducing the very high frequency noise of the voltage regulator output.

17. The method for voltage regulation of claim 11, wherein the very high frequency noise detected is within a predetermined threshold of a power delivery network resonant frequency.

18. The method for voltage regulation of claim 17, wherein the third feedback circuit loop is a band-pass filter with a band frequency centered on the power delivery network resonant frequency.

19. The method for voltage regulation of claim 17, wherein the bandwidth of the third feedback circuit loop is greater than the power delivery network resonant frequency.

20. The method for voltage regulation of claim 17, wherein the power delivery network resonant frequency is at or about 150 MHz.

* * * * *